(12) United States Patent
Harris et al.

(10) Patent No.: US 7,960,043 B2
(45) Date of Patent: Jun. 14, 2011

(54) PHOTO-INDUCED HYDROPHILIC ARTICLE AND METHOD OF MAKING SAME

(75) Inventors: Caroline S. Harris, Pittsburgh, PA (US); Janos Szanyi, Richland, WA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 1047 days.

(21) Appl. No.: 11/705,550

(22) Filed: Feb. 12, 2007

(65) Prior Publication Data

US 2007/0218265 A1    Sep. 20, 2007

Related U.S. Application Data

(60) Continuation of application No. 10/075,996, filed on Feb. 14, 2002, now abandoned, which is a continuation-in-part of application No. 09/282,943, filed on Apr. 1, 1999, now Pat. No. 6,413,581, which is a division of application No. 08/899,257, filed on Jul. 23, 1997, now Pat. No. 6,027,766.

(60) Provisional application No. 60/040,566, filed on Mar. 14, 1997, provisional application No. 60/272,197, filed on Feb. 28, 2001.

(51) Int. Cl.
   *B32B 15/04* (2006.01)

(52) U.S. Cl. .......................... 428/702; 428/432; 428/409
(58) Field of Classification Search .................. 428/426, 428/427, 428, 432, 409, 304.4, 688, 702
See application file for complete search history.

(56) References Cited

U.S. PATENT DOCUMENTS

| 6,312,131 B1 * | 11/2001 | Yamamoto et al. | 359/507 |
| 2003/0027000 A1 * | 2/2003 | Greenberg et al. | 428/432 |

OTHER PUBLICATIONS

Plastic Technology (http://www.ptonline.com/articles/200403fa3.html), obtained Mar. 5, 2010.*

* cited by examiner

*Primary Examiner* — Timothy M Speer
*Assistant Examiner* — Lauren Robinson
(74) *Attorney, Agent, or Firm* — Andrew C. Siminerio

(57) ABSTRACT

Methods and articles are disclosed in which a substrate is provided with a photo-induced hydrophilic surface by forming a photo-induced hydrophilic coating on the substrate by spray pyrolysis, chemical vapor deposition, or magnetron sputter vacuum deposition. The coating can have a thickness of 50 Å to 500 Å, a root mean square roughness of less than 5, preferably less than 2, and photocatalytic activity of less than $3.0 \times 10^{-3}$ cm$^{-1}$ min$^{-1}$ ± $2.0 \times 10^{-3}$ cm$^{-1}$ min$^{-1}$. The substrate includes glass substrates, including glass sheets and continuous float glass ribbons.

14 Claims, 2 Drawing Sheets

PHOTO-INDUCED HYDROPHILIC ARTICLE AND METHOD OF MAKING SAME

CROSS REFERENCE TO RELATED APPLICATIONS

This application is a continuation of U.S. patent application Ser. No. 10/075,996 filed Feb. 14, 2002 (now abandoned), which is a continuation-in-part of U.S. application Ser. No. 09/282,943 to Greenberg et al., entitled "Photocatalytically-Activated Self-Cleaning Appliances", filed Apr. 1, 1999, now U.S. Pat. No. 6,413,581 which is a divisional of U.S. application Ser. No. 08/899,257, filed Jul. 23, 1997 (now U.S. Pat. No. 6,027,766), which claimed the benefit of U.S. Provisional Application Ser. No. 60/040,566, filed Mar. 14, 1997, all of which applications are herein incorporated by reference in their entirety. This application also claims the benefits of U.S. Provisional Application Ser. No. 60/272,197 filed Feb. 28, 2001 entitled "Photo-Induced Hydrophilic Article and Method of Making Same", which is herein incorporated by reference in its entirety.

FIELD OF THE INVENTION

The present invention relates to methods of depositing hydrophilic coatings on a substrate (e.g., a glass sheet or a continuous float glass ribbon) and to articles of manufacture prepared according to the methods.

TECHNICAL CONSIDERATIONS

In the following discussion, general technical considerations relating to the present invention will be discussed. However, it is not to be presumed that the specific references discussed herein constitute "prior art" under United States patent regulations and no such admission is made.

For many substrates, e.g., glass substrates such as architectural windows, automotive transparencies, and aircraft windows, it is desirable for good visibility that the surface of the substrate is substantially free of surface contaminants, such as common organic and inorganic surface contaminants, for as long a duration as possible. Traditionally, this has meant that these surfaces are cleaned frequently. This cleaning operation is typically performed by manually wiping the surface with or without the aid of chemical cleaning solutions. This approach can be labor, time, and/or cost intensive. Therefore, a need exists for substrates, particularly glass substrates, having surfaces that are easier to clean than existing glass substrates and which reduce the need or frequency for such manual cleaning.

It is known that some semiconductor metal oxides can be incorporated into a coating to provide photocatalytically-activated (hereinafter "PA") coatings having self-cleaning properties, i.e., coatings which upon exposure to certain electromagnetic radiation interact with organic contaminants on the coating surface to degrade or decompose the contaminants. A bibliography of patents and articles relating generally to the photocatalytic oxidation of organic compounds is reported in *Bibliography of Work On The Photocatalytic Removal of Hazardous Compounds from Water and Air*, D. Blake, National Renewable Energy Laboratory (May 1994) and in an October 1995 update and an October 1996 update.

Typically, these PA coatings are made sufficiently thick to have a photocatalytic activity sufficient to break down or decompose organic contaminants on the coating in as short a time as possible. For example, WO 00/75087 discloses a photocatalytically-activated coating having a minimum photocatalytic activity of $5 \times 10^{-3}$ centimeters$^{-1}$ minutes$^{-1}$ (cm$^{-1}$ min$^{-1}$). Additional PA coatings are described, for example, in U.S. Pat. Nos. 5,873,203; 6,027,766; and 6,054,227.

In addition to their self-cleaning properties, these PA coatings are also typically hydrophilic, i.e. water wetting. The hydrophilicity of the PA coatings helps reduce fogging, i.e. the accumulation of water droplets on the coating, which can decrease visible light transmission and visibility through the coated substrate. This hydrophilicity has heretofore been associated with several factors, among which are increased surface roughness (rugosity) of the coating surface and increased coating porosity. For example, U.S. Pat. No. 6,103,363 discloses a hydrophilic, photocatalytically-activated self-cleaning coating having a preferred root mean square (RMS) surface roughness of 5 nanometers (nm) to 15 nm and a preferred porosity of 70% to 90%. However, this degree of surface roughness can make cleaning of the surface more difficult, for example, by providing small pockets where dirt and grime can accumulate or by snagging or tearing fibers from a cleaning cloth rubbed over the surface. Moreover, increasing the coating porosity provides channels through which the underlying substrate can be chemically attacked.

In order to achieve the previously desired levels of coating thickness, photocatalytic activity, surface roughness, and coating porosity, many PA self-cleaning coatings have been deposited by sol-gel techniques. In a typical sol-gel process, an uncrystallized colloidal suspension is coated onto a substrate at or about room temperature and then heated to form a crystallized coating. For example, U.S. Pat. No. 6,013,372 discloses a hydrophilic, photocatalytic, self-cleaning coating formed by blending particles of photocatalyst in a layer of metal oxide and applying the blend to a substrate by a sol-gel process.

However, conventional sol-gel coating methods are not economically or practically compatible with certain application conditions or substrates. For example, in a conventional float glass process, the float glass ribbon in the molten metal bath can be too hot to accept the sol due to evaporation or chemical reaction of the solvent used in the sol. Additionally, the environment in the molten metal bath is not conducive to moving machinery, such as spray devices, which would be required to apply the sol. Therefore, the sol must typically be applied after the float glass ribbon has exited the molten metal bath and has cooled to about room temperature. The coated ribbon must then be reheated to a temperature sufficient to crystallize the coating. Such cooling and reheating operations require a substantial investment in equipment, energy, and handling costs, and significantly decrease production efficiency. Further, reheating a sodium containing substrate, such as soda-lime-silica glass, increases the opportunity for sodium ions in the substrate to migrate into the coating, which is conventionally referred to as "sodium ion poisoning" of the deposited coating. The presence of these sodium ions can reduce or destroy the photocatalytic activity of the self-cleaning coating. Moreover, the sol-gel method typically produces thick coatings, e.g., several microns thick, which can have an adverse affect on the optical and/or aesthetic properties of coated articles. Typically, as the thickness of the PA self-cleaning coating increases, the light transmittance and the reflectance of the coating go through a series of minimums and maximums due to optical interference effects. The reflected and transmitted color of the coating also varies due to these optical effects. Thus, coatings thick enough to provide the desired self-cleaning properties can have undesirable optical characteristics.

Therefore, it would be advantageous to provide an article of manufacture having a coating, particularly a hydrophilic coating, and a method of making the article which reduce or eliminate at least some of these drawbacks.

SUMMARY OF THE INVENTION

The present invention is directed to an article of manufacture which includes a substrate having at least one surface and a hydrophilic coating, particularly a photo-induced hydrophilic coating (defined below), deposited over at least a portion of the surface. The coating can be deposited by a process selected from chemical vapor deposition (hereinafter "CVD"), spray pyrolysis, and/or magnetron sputtered vacuum deposition (hereinafter "MSVD"). In one embodiment, the coating, e.g., an outer surface of the coating, can have a root mean square roughness in the range of greater than or equal to 0 nm to less than or equal to 4 nm, e.g., less than or equal to 3 nm, e.g., less than or equal to 2 nm, e.g., less than or equal to 1 nm. It is particularly advantageous if the substrate is a float glass ribbon and the coating is deposited in a molten tin bath by CVD during manufacture of the float glass ribbon. In another particular embodiment of the invention, the photo-induced hydrophilic coating has a photocatalytic activity in the range of greater than or equal to 0 cm$^{-1}$ min$^{-1}$ to less than or equal to 3×10$^{-3}$ cm$^{-1}$ min$^{-1}$, e.g., less than or equal to 2×10$^{-3}$ cm$^{-1}$ min$^{-1}$. In another embodiment of the invention, the substrate is a float glass ribbon located in a molten metal bath, the photo-induced hydrophilic coating has a thickness in the range of greater than 0 Å to less than or equal to 500 Å, and the photo-induced hydrophilic coating is deposited in the molten metal bath by chemical vapor deposition. The present invention is also directed to methods of making such articles.

It has been surprisingly discovered that very thin semiconductor metal oxide coatings, e.g., on the order of greater than 0 Å to less than or equal to 500 Å, which are thinner than the coatings typically utilized to achieve photocatalytic self-cleaning properties, retain their hydrophilicity even when the photocatalytic activity of the very thin coating is below that typically desired for self-cleaning coatings to decompose organic contaminants. Thus, while the thin semiconductor metal oxide coating remains sufficiently photoactive to be hydrophilic, it may not be sufficiently photoactive to have measurable or commercially acceptable photocatalytic self-cleaning activity over time. This photo-induced hydrophilicity provides reduced fogging and/or also makes the coated article easier to clean, e.g., easier to wipe to remove dirt and/or water spots, than the non-coated article. Moreover, the photo-induced hydrophilicity also provides water sheeting and faster drying, which reduce water spots because water does not tend to bead-up to leave spots. Dirt can also be more easily removed simply by rinsing the coating without manually wiping the coating. Additionally, these very thin semiconductor metal oxide coatings suffer less from the undesirable optical problems associated with thicker photocatalytic self-cleaning coatings. It has also been surprisingly discovered that these very thin semiconductor metal oxide coatings can be made much smoother and denser than previously thought while still retaining their photo-induced hydrophilicity. One example of a suitable semiconductor metal oxide which can be used in the practice of the invention is an oxide of titanium.

In one embodiment, the invention provides a substrate having at least one surface with a photo-induced hydrophilic semiconductor metal oxide coating, such as a titanium dioxide coating, deposited over at least a portion of the surface by CVD, spray pyrolysis, or MSVD. The coating can have a thickness in the range of greater than 0 Å to less than or equal to 500 Å, e.g., less than or equal to 400 Å, e.g., less than or equal to 300 Å, and the outer surface of the coating generally can have an RMS roughness of greater than or equal to 0 nm to less than or equal to 2 nm, such as 1.9 nm or less, e.g., 1 nm or less. For coatings of the invention having a thickness of around 200 Å or less, the coating surface can be less smooth, e.g., can have an RMS roughness of 5 nm or less, e.g., 4.9 nm or less, e.g., 4 nm or less, e.g., 3 nm or less, e.g., 2 nm or less, e.g., 1 nm or less. In a particular embodiment, the substrate is a float glass ribbon located in a molten tin bath.

In one embodiment, the invention provides an article comprising a float glass ribbon having at least one surface and a photo-induced hydrophilic coating deposited directly on at least a portion of the at least one surface. The photo-induced hydrophilic coating can be deposited directly on the float glass ribbon in a molten metal bath.

The invention also provides an article comprising a substrate having at least one surface and a photo-induced hydrophilic coating deposited over at least a portion of the at least one surface. The substrate can be a float glass ribbon located in a molten metal bath, the photo-induced hydrophilic coating can have a thickness of 500 Å or less, and the photo-induced hydrophilic coating can be deposited over the at least one surface in a molten metal bath by chemical vapor deposition.

The invention further provides an article comprising a substrate having at least one surface and a photo-induced hydrophilic coating deposited over at least a portion of the at least one surface. The photo-induced hydrophilic coating can be deposited by chemical vapor deposition at a temperature in the range of 500° C. to 1200° C., and the photo-induced hydrophilic coating can have a thickness of 500 Å or less.

A method is provided for forming a photo-induced hydrophilic coating over at least a portion of a substrate. The method includes providing a substrate having a first surface and a second surface, with at least one of the surfaces having tin diffused therein; depositing a metal oxide precursor from a coating device onto at least one of the surfaces by a process selected from chemical vapor deposition, spray pyrolysis, and magnetron sputtered vacuum deposition; and heating the substrate to a temperature sufficient to decompose the metal oxide precursor to form the photo-induced hydrophilic coating having a root mean square roughness of 2 nm or less.

Another method of forming a photo-induced hydrophilic coating over at least a portion of a substrate comprises providing a float glass ribbon in a molten metal bath; depositing a metal oxide precursor material from a coating device directly onto a top surface of the glass ribbon by chemical vapor deposition; and heating the glass ribbon to a temperature sufficient to decompose the metal oxide precursor material to form the photo-induced hydrophilic coating.

A further method of forming a photo-induced hydrophilic coating over at least a portion of a substrate comprises providing a substrate having at least one surface; depositing a metal oxide precursor material from a CVD coating device over at least a portion of the at least one surface; heating the substrate to a temperature in the range of 400° C. to 1200° C. to decompose the metal oxide precursor material to form the photo-induced hydrophilic coating; and providing sufficient precursor material such that the photo-induced hydrophilic coating has a thickness of 500 Å or less.

The invention also relates to a product formed by a method of the invention.

DESCRIPTION OF THE INVENTION

Figure 1:
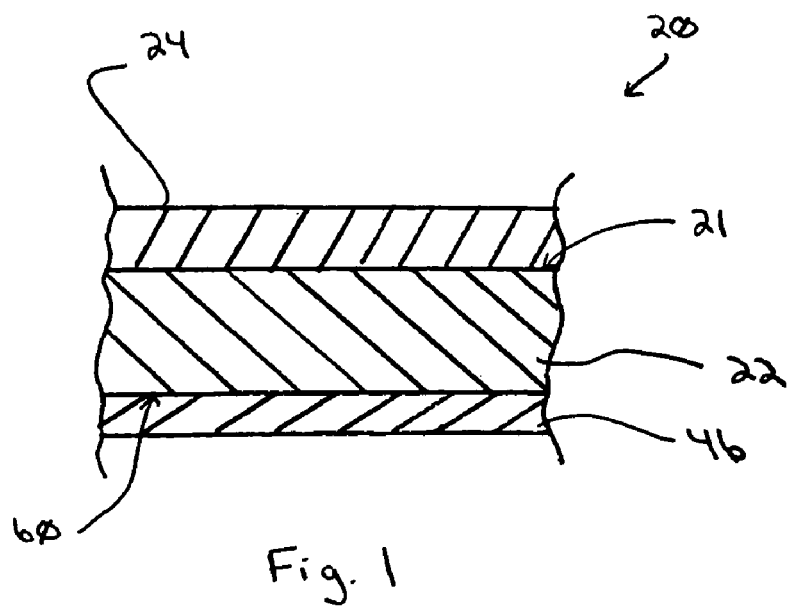
FIG. 1 is a sectional view (not to scale) of a portion of a substrate having a photo-induced hydrophilic coating of the invention deposited thereon.

As used herein, spatial or directional terms, such as "inner", "outer", "above", "below", "top", "bottom", and the like, relate to the invention as it is shown in the drawing figures. However, it is to be understood that the invention can assume various alternative orientations and, accordingly, such terms are not to be considered as limiting. Further, all numbers expressing dimensions, physical characteristics, processing parameters, quantities of ingredients, reaction conditions, and the like used in the specification and claims are to be understood as being modified in all instances by the term "about". Accordingly, unless indicated to the contrary, the numerical values set forth in the following specification and claims are approximations that can vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 5.5 to 10. Further, as used herein, the terms "deposited over" or "provided over" mean deposited or provided on but not necessarily in surface contact with. For example, a coating "deposited over" a substrate does not preclude the presence of one or more other coating films of the same or different composition located between the deposited coating and the substrate. Additionally, all percentages disclosed herein are "by weight" unless indicated to the contrary. All photocatalytic activity values discussed herein are those determined by the conventional stearic acid test described in U.S. Pat. No. 6,027,766, herein incorporated by reference. All root mean square roughness values are those determinable by atomic force microscopy by measurement of the root mean square (RMS) over a surface area of one square micrometer. Additionally, any reference referred to as "incorporated by reference" herein is to be understood as being incorporated in its entirety.

Referring now to FIG. 1, there is shown an article 20 having features of the present invention. The article 20 includes a substrate 22 having a surface 21 with a photo-induced hydrophilic (hereinafter PH) coating 24 of the invention deposited over at least a portion of the surface 21. As used herein, the term "photo-induced hydrophilic coating" refers to a material or coating which is photoactively hydrophilic. By "photoactively hydrophilic" is meant a coating for which the contact angle of a water droplet on the coating surface decreases with time as a result of exposure of the coating to electromagnetic radiation. For example, the contact angle can decrease to a value less than 15°, such as less than 10°, and can become superhydrophilic, e.g., decreases to less than or equal to 5°, e.g., less than or equal to 4°, e.g., less than or equal to 35° after sixty minutes of exposure to ultraviolet radiation from a light source sold under the tradename UVA 340 from the Q-Panel Company of Cleveland, Ohio, positioned to have an intensity of 24 W/m$^2$ at the PH coating surface. The contact angle can drop even farther, e.g., less than or equal to 2°, e.g., less than or equal to 1°, upon longer exposure to the light source or upon exposure to different light sources and/or different illumination intensities.

Although not to be considered as limiting to the invention, it is believed that the PH coating of the invention is photoactive or behaves photoactively. As will be appreciated by one skilled in the art, the terms "photoactive" or "photoactively" refer to the photogeneration of a hole-electron pair when illuminated with radiation of a particular frequency. Exemplary photoactive materials useful in the practice of the invention include semiconductor metal oxides. Although photoactively hydrophilic, the coating 24 may not necessarily be photocatalytic to the extent that it is self-cleaning, i.e., may not be sufficiently photocatalytic to decompose organic materials like grime on the coating surface in a reasonable or economically useful period of time.

In the broad practice of the invention, the substrate 22 can be of any desired material having any desired optical characteristics. For example, the substrate 22 can be transparent to visible light. By "transparent" is meant having a transmittance through the substrate 22 of greater than 0% up to 100%. By "visible light" is meant electromagnetic energy in the range of 395 nm to 800 nm. Alternatively, the substrate 22 can be translucent or opaque. By "translucent" is meant allowing electromagnetic energy (e.g., visible light) to pass through but diffusing it such that objects on the other side are not clearly visible. By "opaque" is meant having a visible light transmittance of 0%. Suitable materials for the substrate 22 include plastic (e.g., polymethylmethacrylate, polycarbonate, polyurethane, polyethyleneterephthalate (PET), or copolymers of any monomers for preparing these, or mixtures thereof), ceramic, or glass. The glass can be of any type, such as conventional float glass or flat glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. The ribbon is then cut and/or shaped and/or heat treated as desired. Examples of float glass processes are disclosed in U.S. Pat. Nos. 4,466,562 and 4,671,155. The glass can be, for example, conventional soda-lime-silicate glass, borosilicate glass, or leaded glass. The glass can be "clear glass", i.e., non-tinted or non-colored glass. Alternatively, the glass can be tinted or otherwise colored glass. The glass can be untempered, heat treated, or heat strengthened glass. As used herein, the term "heat strengthened" means annealed, tempered, or at least partially tempered. Although not limiting to the invention, examples of glass suitable for the substrate 12 are described in U.S. Pat. Nos. 4,746,347; 4,792,536; 5,240,886; 5,385,872; and 5,393,593, which are herein incorporated by reference. The substrate 22 can be of any desired dimensions, e.g., length, width, shape, or thickness. For example, the substrate 22 can be a glass pane of an architectural window, a skylight, one pane of an insulating glass unit, or a ply for a conventional automotive windshield, side or back window, sun roof, or an aircraft transparency, just to name a few.

The PH coating 24 can be deposited directly on, i.e., in surface contact with, the surface 21 of the substrate 22 as shown in FIG. 1. It has been found that even with a sodium-containing substrate, such as soda-lime-silica glass, the very thin PH coatings of the invention are not rendered non-hydrophilic by sodium in the substrate when the coating is applied by the in-bath method described below. Therefore, an easier to clean soda-lime-silica glass can be made without a sodium barrier layer between the glass and the PH coating of the invention. Optionally, such a barrier layer could be used.

Alternatively, one or more other layers or coatings, e.g., one or more functional coatings (e.g., an antireflective coating) or sodium ion diffusion barrier layers as described below, can be interposed between the PH coating 24 and the substrate 22. For example, the PH coating 24 can be an outer or the outermost layer of a multilayer stack of coatings present on substrate 22 or the PH coating 24 can be embedded as one of the layers other than the outermost layer within such a multilayer stack. By "an outer layer" is meant a layer receiving sufficient exciting electromagnetic radiation, e.g., ultraviolet radiation, to provide the coating with sufficient photoactivity to be photoactively hydrophilic but not necessarily photocatalytic. Preferably, the PH coating 24 is the outermost coating on the substrate 22.

As discussed above, the PH coating 24 need not have a level of photocatalytic activity on the order of previously known self-cleaning coatings. For example, the PH coating 24 can have photocatalytic activity in the range of greater than or equal to $0$ $cm^{-1}$ $min^{-1}$ to less than or equal to $5\times10^{-3}$ $cm^{-1}$ $min^{-1}\pm2\times10^{-3}$ $cm^{-1}$ $min^{-1}$, e.g., less than or equal to $4\times10^{-3}$ $cm^{-1}$ $min^{-1}$, e.g., less than or equal to $3\times10^{-3}$ $cm^{-1}$ $min^{-1}\pm2\times10^{-3}$ $cm^{-1}$ $min^{-1}$, such as less than or equal to $2\times10^{-3}$ $cm^{-1}$ $min^{-1}\pm2\times10^{-3}$ $cm^{-1}$ $min^{-1}$.

The PH coating 24 can include any coating material which is photoactively hydrophilic and which can be deposited by the CVD method, the spray pyrolysis method, or the MSVD method. For example but not limiting to the invention, the PH coating 24 can include one or more metal oxides, metal alloy oxides, or semiconductor metal oxides or metal alloy oxides, such as but not limited to titanium oxides, silicon oxides, aluminum oxides, iron oxides, silver oxides, cobalt oxides, chromium oxides, copper oxides, molybdenum oxides, tungsten oxides, zinc oxides, zinc/tin alloy oxides, zinc stannates, strontium titanate and mixtures or combinations thereof. The metal oxides and/or metal alloy oxides can include oxides, super-oxides or sub-oxides of the metal.

One exemplary PH coating 24 particularly useful in the practice of the invention is titanium dioxide. Titanium dioxide exists in an amorphous form and three crystalline forms, namely the anatase, rutile and brookite crystalline forms. Anatase phase titanium dioxide exhibits strong photoactive hydrophilicity while also possessing excellent resistance to chemical attack and excellent physical durability. The rutile phase of titanium dioxide can also exhibit photoactive hydrophilicity. Mixtures or combinations of the anatase and/or rutile and/or brookite and/or amorphous phases are acceptable for the present invention provided the combination exhibits photoactive hydrophilicity.

The PH coating 24 should be sufficiently thick so as to provide an acceptable level of photoactive hydrophilicity. There is no absolute value which renders the PH coating 24 "acceptable" or "unacceptable" because whether a PH coating has an acceptable level of photoactive hydrophilicity varies depending largely on the purpose and conditions under which the PH coated article is being used and the performance standards selected to match that purpose. However, as discussed above, the thickness of the PH coating 24 to achieve photoactive hydrophilicity can be much less than is needed to achieve a conventional commercially acceptable level of photocatalytic self-cleaning activity. For example, the PH coating 24 can have a thickness in the range of 10 Å to 5000 Å, where thicker coatings in this range can have photocatalytic self-cleaning activity as well as hydrophilicity. As the coatings get thinner in this range, photocatalytic self-cleaning activity typically decreases. As coating thickness decreases in such ranges as 50 Å to 3000 Å, e.g., 100 Å to 1000 Å, e.g., 200 Å to 500 Å, e.g., 200 Å to 300 Å, photocatalytic self-cleaning activity may be unmeasurable but hydrophilicity is still present in the presence of selected electromagnetic radiation. It has been found that when the substrate 22 is a piece of float glass and the PH coating 24 has some anatase titanium dioxide PH coating formed directly over the piece of float glass by the CVD method, that a thickness of 200 Å to 300 Å provides a photocatalytic activity in the range of 0 to $2\times10^{-3}$ $cm^{-1}$ $min^{-1}\pm2\times10^{-3}$ $cm^{-1}$ $min^{-1}$, e.g., $1.8\times10^{-3}$ $cm^{-1}$ $min^{-1}$ to $2.8\times10^{-3}$ $cm^{-1}$ $min^{-1}$, for the removal of a stearic acid test film when the PH coating was exposed to ultraviolet radiation from the UVA-340 light source having an intensity of 24 W/m$^2$ at the PH coating surface. This PH coating was also super hydrophilic under this same radiation and had a water droplet contact angle in the range of $4°\pm2°$ to $7°\pm2°$ after 60 mins of exposure to the UVA-340 light source. As will be appreciated by one skilled in the art, the coating may not be uniformly thick over its entire area. Therefore, the thickness values discussed herein should be considered average thicknesses over the entire coating.

In another aspect of the invention, the outer surface of the PH coating 24 of the invention can be much smoother than previous hydrophilic self-cleaning coatings while still maintaining its photoactive hydrophilicity. For example, the coating 24, in particular the top or outer surface of the coating, can have an RMS roughness in the range of greater than or equal to 0 nm to less than 5 nm even for thin coatings in the above ranges, such as 200 Å to 300 Å, e.g., less than or equal to 4.9 nm, e.g., less than or equal to 4 nm, e.g., less than or equal to 3 nm, e.g., less than or equal to 2 nm, e.g., less than or equal to 1 nm e.g., 0.3 nm to 0.7 nm. For example, the 200 Å to 300 Å PH coating discussed immediately above had a RMS surface roughness of 0.55 nm to 0.65 nm as measured by atomic force microscopy.

In a further aspect of the invention, the PH coating 24 can have a low visible light reflectance. As used herein, "visible light reflectance" refers to the conventional chromaticity coordinate designation $(R_1)$ Y (Illuminant C, 2 degrees observer). For example, the PH coated article can have a visible light reflectance in the range of 10% to 25%, e.g., 15% to 25%, e.g., 19% to 24%, e.g., 15% to 22%, e.g., less than or equal to 25%, e.g., less than or equal to 23%, e.g., less than or equal to 20%.

In a still further aspect of the invention, the PH coating 24 can be made denser than previous hydrophilic, self-cleaning coatings. For example, the PH coating 24 can be substantially non-porous. By "substantially non-porous" is meant that the coating is sufficiently dense that the coating can withstand a conventional hydrofluoric acid drop test. In the drop test, two (2) drops of a 0.5 volume percent (vol. %) aqueous hydrofluoric acid (HF) solution are placed on a coated sample and a conventional laboratory watch glass is placed over the sample for 8 minutes (mins) at room temperature. After 8 minutes, the watch glass is removed and the coating inspected for damage. The denser PH coatings 24 of the invention provide more protection to the underlying substrate against chemical attack than previous more porous self-cleaning coatings and also are harder and more scratch resistant than previous sol-gel applied self-cleaning coatings.

In accordance with the present invention, a PH coating having a thickness in the range of 10 Å to 500 Å, such as less than or equal to 400 Å, e.g., 200 Å to 300 Å, can be formed on the substrate 22 by any one or more of spray pyrolysis, CVD, or MSVD. In the spray pyrolysis method, an organic or metal-containing precursor is carried in an aqueous suspension, e.g. an aqueous solution, and in the CVD method is carried in a carrier gas, e.g. nitrogen gas, and is directed toward the surface of the substrate 22 while the substrate 22 is at a temperature high enough to cause the precursor to decompose and to form a PH coating 24 on the substrate 22. In the MSVD method, a metal-containing cathode target is sputtered under negative pressure in an inert or oxygen-containing atmosphere to deposit a sputter coating over substrate 22. The substrate 22 can be heated during or after coating to cause crystallization of the sputter coating to form the PH coating 24. Conventional spray pyrolysis, CVD, and MSVD methods will be well understood by one of ordinary skill in the art and, hence, will not be described in detail herein.

Each of the methods has advantages and limitations depending upon the desired characteristics of the coating 24 and the type of glass fabrication process. For example, in a conventional float glass process molten glass is poured onto a pool of molten metal, e.g., tin, in a molten metal (tin) bath to form a continuous float glass ribbon. Temperatures of the float glass ribbon in the tin bath generally range from 1203° C. (2200° F.) at the delivery end of the bath to 592° C. (1100° F.) at the exit end of the bath. The float glass ribbon is removed from the tin bath and annealed, i.e. controllably cooled, in a lehr before being cut into glass sheets of desired length and width. The temperature of the float glass ribbon between the tin bath and the annealing lehr can be in the range of 480° C. (896° F.) to 580° C. (1076° F.) and the temperature of the float glass ribbon in the annealing lehr can be in the range of 204° C. (400° F.) to 557° C. (1035° F.) peak. U.S. Pat. Nos. 4,466, 562 and 4,671,155 (hereby incorporated by reference) provide a discussion of the float glass process.

The CVD and spray pyrolysis methods may be preferred over the MSVD method in a float glass process because they are more compatible with coating continuous substrates, such as float glass ribbons, at elevated temperatures. Exemplary CVD and spray pyrolysis coating methods are described in U.S. Pat. Nos. 4,344,986; 4,393,095; 4,400,412; 4,719,126; 4,853,257; and 4,971,843, which patents are hereby incorporated by reference.

In the practice of the invention, one or more CVD coating apparatus can be employed at several points in the float glass-ribbon manufacturing process. For example, CVD coating apparatus can be employed as the float glass ribbon travels through the tin bath, after it exits the tin bath, before it enters the annealing lehr, as it travels through the annealing lehr, or after it exits the annealing lehr. Because the CVD method can coat a moving float glass ribbon yet withstand the harsh environments associated with manufacturing the float glass ribbon, the CVD method is particularly well suited to provide the PH coating 24 on the float glass ribbon in the molten tin bath. U.S. Pat. Nos. 4,853,257; 4,971,843; 5,536,718; 5,464, 657; and 5,599,387, hereby incorporated by reference, describe CVD coating apparatus and methods that can be used in the practice of the invention to coat a float glass ribbon in a molten tin bath.

Figure 2:
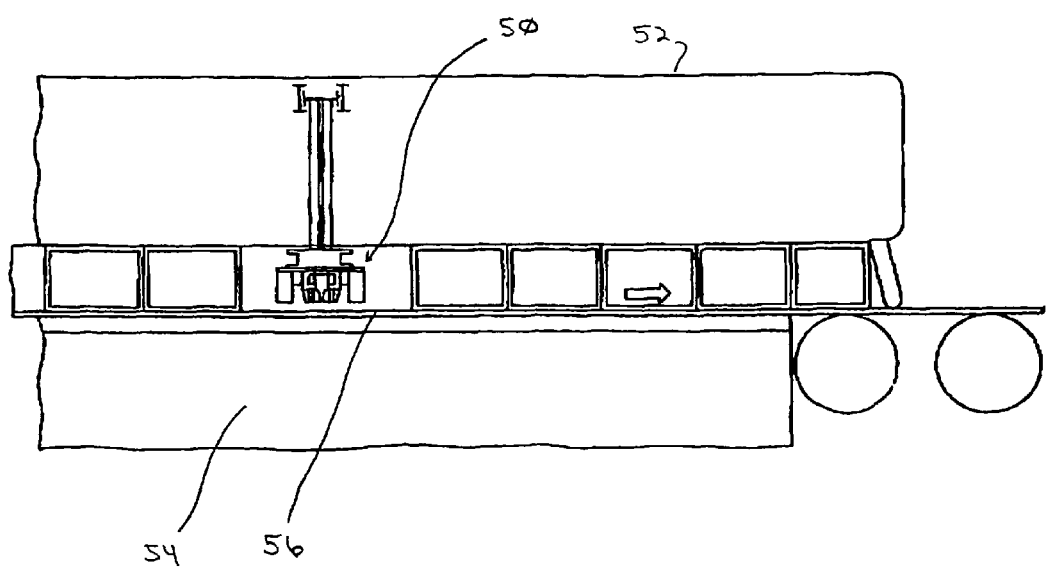
FIG. 2 is a side view (not to scale) of a coating process for applying a semiconductor metal oxide coating of the invention onto a glass ribbon in a molten metal bath for a float glass process.

For example, as shown in FIG. 2, one or more CVD coaters 50 can be located in the tin bath 52 above the molten tin pool 54. As the float glass ribbon 56 moves through the tin bath 52, precursor materials are directed onto the top surface of the ribbon 56. The precursor materials decompose to form a PH coating of the invention having photoactive hydrophilic activity. For example, the precursor materials can be selected to decompose to form semiconductor metal oxides, e.g., crystalline metal oxides. Exemplary precursor materials that can be used in the practice of the present invention to form titanium dioxide PH coatings by the CVD method include but are not limited to titanium tetrachloride ($TiCl_4$), titanium tetraisopropoxide ($Ti(OC_3H_7)_4$) (hereinafter "TTIP"), titanium tetrabutoxide, titanium tetraethoxide ($Ti(OC_2H_5)_4$) (hereinafter "TTEt"), and mixtures thereof. Exemplary carrier gases that can be used in the CVD method include but are not limited to air, nitrogen, oxygen, ammonia and mixtures thereof. The concentration of the metal-containing precursor in the carrier gas can be in the range of 0.01% to 0.4% by volume (vol. %), e.g., 0.05 vol. % to 0.4 vol. %, e.g., 0.05 vol. % to 2 vol. %, e.g., 0.05 vol. % to 1 vol. % for the above-listed metal-containing precursors, but as may be appreciated by those skilled in the art, these concentrations can be varied for other metal-containing precursors.

For the CVD method (as well as the spray pyrolysis method discussed below), the temperature of the substrate 22 (such as a float glass ribbon 56) during formation of the PH coating 24 thereon should be within the range which will cause the metal containing precursor material to decompose and form a coating having photoactive hydrophilic activity. The lower limit of this temperature range is largely affected by the decomposition temperature of the selected metal-containing precursor. For the above listed titanium-containing precursors, the lower temperature limit of the substrate 22 to provide sufficient decomposition of the precursor can be in the range of 400° C. (752° F.) to 500° C. (932° F.). The upper limit of this temperature range can be affected by the method of coating the substrate. For example, where the substrate 22 is a float glass ribbon 56 and the PH coating 24 is applied to the float glass ribbon 56 in the molten tin bath 50 during manufacture of the float glass ribbon 56, the float glass ribbon 56 can reach temperatures in excess of 1000° C. (1832° F.). The float glass ribbon 56 can be attenuated or sized (e.g. stretched or compressed) at temperatures above 800° C. (1472° F.) If the PH coating 24 is applied to the float glass ribbon 56 before or during attenuation, the PH coating 24 can crack or crinkle as the float glass ribbon 56 is stretched or compressed respectively. Therefore, the PH coating can be applied when the float glass ribbon 56 is dimensionally (except for thermal contraction with cooling) stable, e.g., below 800° C. (1472° F.) for soda lime silica glass, and the float glass ribbon 56 is at a temperature to decompose the metal-containing precursor, e.g., above 400° C. (752° F.)

For spray pyrolysis, U.S. Pat. Nos. 4,719,126; 4,719,127; 4,111,150; and 8,660,061, hereby incorporated by reference, describe spray pyrolysis apparatus and methods that can be used with a conventional float glass ribbon manufacturing process. While the spray pyrolysis method like the CVD method is well suited for coating a moving float glass ribbon, the spray pyrolysis has more complex equipment than the CVD equipment and is usually employed between the exit end of the tin bath and the entrance end of the annealing lehr.

Exemplary metal-containing precursors that can be used in the practice of the invention to form PH coatings by the spray pyrolysis method include relatively water insoluble organometallic reactants, specifically metal acetylacetonate compounds, which are jet milled or wet ground to a particle size of less than 10 microns and suspended in an aqueous medium by the use of a chemical wetting agent. A suitable metal acetylacetonate to form a titanium dioxide PH coating is titanyl acetylacetonate ($TiO(C_5H_7O_2)_2$). The relative concentration of the metal acetylacetonate in the aqueous suspension preferably ranges from 5 to 40 weight percent of the aqueous suspension. The wetting agent can be any relatively low foaming surfactant, including anionic, nonionic or cationic compositions, although nonionic is preferred. The wetting agent is typically added at 0.24% by weight, but can range from 0.01% to 1% or more. The aqueous medium is preferably distilled or deionized water. Aqueous suspensions for pyrolytic deposition of metal-containing films are described in U.S. Pat. No. 4,719,127 particularly at column 2, line 16, to column 4, line 48, which is hereby incorporated herein by reference.

As will be appreciated by those skilled in the art, the bottom surface of the float glass ribbon resting directly on the molten tin (commonly referred to as the "tin side") has diffused tin in the surface which provides the tin side with a pattern of tin absorption that is different from the opposing surface not in contact with the molten tin (commonly referred to as "the air side"). The PH coating of the invention can be formed on the air side of the float glass ribbon while it is supported on the tin by the CVD method as described above, on the air side of the float glass ribbon after it leaves the tin bath by either the CVD or spray pyrolysis methods, and/or on the tin side of the float glass ribbon after it exits the tin bath by the CVD method.

With respect to MSVD, U.S. Pat. Nos. 4,379,040; 4,861,669; 4,900,633; 4,920,006; 4,938,857; 5,328,768; and 5,492,750, hereby incorporated by reference, describe MSVD apparatus and methods to sputter coat metal oxide films on a substrate, including a glass substrate. The MSVD process is not generally compatible with providing a PH coating over a float glass ribbon during its manufacture because, among other things, the MSVD process requires negative pressure during the sputtering operation which is difficult to form over a continuous moving float glass ribbon. However, the MSVD method is acceptable to deposit the PH coating 24 on substrate 22, e.g., a glass sheet. The substrate 22 can be heated to temperatures in the range of 400° C. (752° F.) to 500° C. (932° F.) so that the MSVD sputtered coating on the substrate crystallizes during deposition process thereby eliminating a subsequent heating operation. Heating the substrate during sputtering may not be preferred in some cases because the additional heating operation during sputtering can decrease throughput. Alternatively, the sputter coating may be crystallized within the MSVD coating apparatus directly and without post heat treatment by using a high energy plasma, but again because of its tendency to reduce throughput through an MSVD coater, this is not a preferred method.

An exemplary method to provide a PH coating (especially a PH coating of 300 Å or less and having an RMS roughness of 2 nm or less) using the MSVD method is to sputter a coating on the substrate, remove the coated substrate from the MSVD coater, and thereafter heat treat the coated substrate to crystallize the sputter coating into the PH coating 24. For example, but not limiting to the invention, a target of titanium metal can be sputtered in an argon/oxygen atmosphere having 5-50%, e.g., 20% oxygen, at a pressure of 5-10 millitorr to sputter deposit a titanium dioxide coating of desired thickness on the substrate 22. The coating as deposited is not crystallized. The coated substrate is removed from the coater and heated to a temperature in the range of 400° C. (752° F.) to 60° C. (1112° F.) for a time period sufficient to promote formation of the PH crystalline form of titanium dioxide to render PH activity. For example, the coated substrate can be heated for at least an hour at temperature in the range of 400° C. (752° F.) to 600° C. (1112° F.) Where the substrate 22 is a glass sheet cut from a float glass ribbon, the PH coating 24 can be sputter deposited on the air side and/or the tin side.

The substrate 22 having the PH coating 24 deposited by CVD, spray pyrolysis or MSVD methods can be subsequently subjected to one or more post-PH coating annealing operations. As can be appreciated, the time and temperatures of the anneal can be affected by several factors, including the makeup of substrate 22, the makeup of PH coating 24, the thickness of the PH coating 24, and whether the PH coating 24 is directly in contact with the substrate 22 or is one layer of a multilayer stack on substrate 22.

Whether the PH coating is provided by the CVD process, the spray pyrolysis process, or the MSVD process, where the substrate 22 includes sodium ions that can migrate from the substrate 22 into the PH coating deposited on substrate 22, the sodium ions can inhibit or destroy the photoactive hydrophilicity of the PH coating by forming inactive compounds while consuming titanium, e.g., by forming sodium titanates or by causing recombination of photoexcited charges. Therefore, a sodium ion diffusion barrier (SIDB) layer can be deposited over the substrate before deposition of the PH coating 24. A suitable SIDB layer is discussed in detail in U.S. Pat. No. 6,027,766, herein incorporated by reference, and will not be discussed in detail herein. With post-coating heating, it can be preferred to have a sodium barrier layer for sodium containing substrates, such as soda-lime-silica glass. For applying the PH coating of the invention in a molten metal bath, the sodium barrier layer is optional.

The PH coatings of the present invention are preferably photoactively hydrophilic upon exposure to radiation in the ultraviolet range, e.g., 300 nm to 395 nm, of the electromagnetic spectrum. Sources of ultraviolet radiation include natural sources, e.g., solar radiation, and artificial sources such as a black light or an ultraviolet light source such as the UVA-340 light source as described above.

As shown in FIG. 1, in addition to the PH coating 24 of the invention, one or more additional coatings, such as functional coatings 46 (as described below), can be deposited on or over the substrate 22. For example, a functional coating 46 can be deposited over a major surface 60 of the substrate 22 which is opposite the surface 21. The functional coating 46 can be deposited by any conventional method, such as but not limited to spray pyrolysis, CVD, MSVD, sol-gel, etc. For example, U.S. Pat. Nos. 4,584,206 and 4,900,110, herein incorporated by reference, disclose methods and apparatus for depositing a metal containing film on the bottom surface of a glass ribbon by chemical vapor deposition. Such a known apparatus can be located downstream of the molten tin bath in the float glass process to provide a functional coating on the underside of the glass ribbon, i.e., the side opposite the PH coating of the invention. Alternatively, one or more other CVD coaters can be located in the tin bath to deposit a functional coating either above or below the PH coating 24 on the float glass ribbon.

Figure 3:
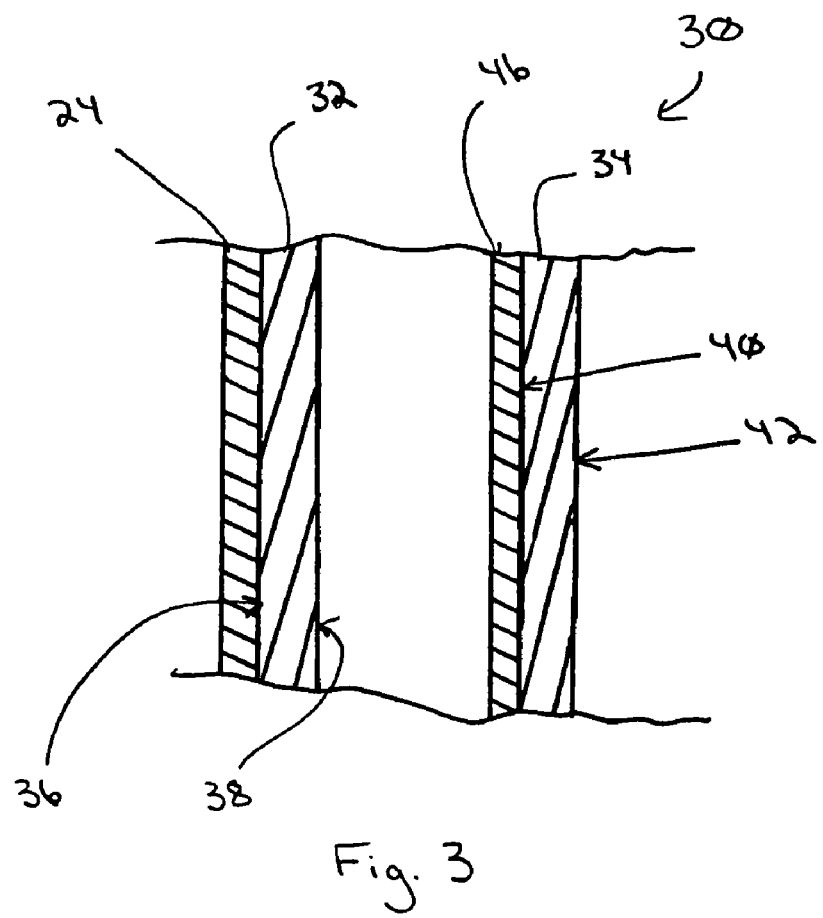
FIG. 3 is a side view (not to scale) of an insulating glass unit incorporating features of the invention.

An exemplary article of manufacture of the invention is shown in FIG. 3 in the form of an insulating glass (IG) unit 30. The insulating glass unit has a first pane 32 spaced from a second pane 34 by a spacer assembly (not shown) and held in place by a sealant system to form a chamber between the two panes 32, 34. The first pane 32 has a first surface 36 (number 1 surface) and a second surface 38 (number 2 surface). The second pane 34 has a first surface 40 (number 3 surface) and a second surface 42 (number 4 surface). The first surface 36 can be the exterior surface of the IG unit, i.e. the surface exposed to the environment, and the second surface 42 can be the interior surface, i.e. the surface forming the inside of the structure. Examples of IG units are disclosed in U.S. Pat. Nos. 4,193,236; 4,464,874; 5,088,258; and 5,106,663, herein incorporated by reference. As shown in FIG. 3, the PH coating 24 is preferably positioned on the number 1 or number 4 surfaces, preferably on the number 1 surface. The PH coating 24 reduces fogging and makes the IG unit 30 easier to clean and maintain.

One or more optional functional coatings 46 can be deposited over at least a portion of the number 2, number 3, or number 4 surfaces. As used herein, the term "functional coating" refers to a coating which modifies one or more physical properties of the substrate over which it is deposited, e.g., optical, thermal, chemical or mechanical properties, and is not intended to be removed from the substrate during subsequent processing. The functional coating 46 can have one or more functional coating films of the same or different composition or functionality. As used herein, the terms "layer" or "film" refer to a coating region of a desired or selected coating composition. The film can be homogeneous, non-homogeneous, or have a graded compositional change. A film is "homogeneous" when the outer surface or portion (i.e., the surface or portion farthest from the substrate), the inner surface or portion (i.e., the surface or portion closest to the substrate) and the portion between the outer and inner surfaces have substantially the same composition. A film is "graded" when the film has a substantially increasing fraction of one or more components and a substantially decreasing fraction of one or more other components when moving from the inner surface to the outer surface or vice versa. A film is "non-homogeneous" when the film is other than homogeneous or graded. A "coating" is composed of one or more "films".

The functional coating 46 can be an electrically conductive coating, such as, for example, an electrically conductive heated window coating as disclosed in U.S. Pat. Nos. 5,653,903 and 5,028,759, or a single-film or multi-film coating capable of functioning as an antenna. Likewise, the functional coating 46 can be a solar control coating, for example, a visible, infrared or ultraviolet energy reflecting or absorbing coating. Examples of suitable solar control coatings are found in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759, and also in U.S. patent application Ser. No. 09/058,440. Similarly, the functional coating 46 can be a low emissivity coating. "Low emissivity coatings" allow visible wavelength energy, e.g., 400 nm to 780 nm, to be transmitted through the coating but reflect longer-wavelength solar infrared energy and/or thermal infrared energy and are typically intended to improve the thermal insulating properties of architectural glazings. By "low emissivity" is meant emissivity less than 0.4, preferably less than 0.3, more preferably less than 0.2. Examples of low emissivity coatings are found, for example, in U.S. Pat. Nos. 4,952,423 and 4,504,109 and British reference GB 2,302,102. The functional coating 46 can be a single layer or multiple layer coating and can comprise one or more metals, non-metals, semi-metals, semiconductors, and/or alloys, compounds, composites, combinations, or blends thereof. For example, the functional coating 46 can be a single layer metal oxide coating, a multiple layer metal oxide coating, a non-metal oxide coating, or a multiple layer coating. Additionally, the functional coating can be an antireflective coating.

Examples of suitable functional coatings for use with the invention are commercially available from PPG Industries, Inc. of Pittsburgh, Pa. under the SUNGATE® and SOLARBAN® families of coatings. Such functional coatings typically include one or more anti-reflective coating films comprising dielectric or anti-reflective materials, such as metal oxides or oxides of metal alloys, which are preferably transparent or substantially transparent to visible light. The functional coating 46 can also include infrared reflective films comprising a reflective metal, e.g., a noble metal such as gold, copper or silver, or combinations or alloys thereof, and can further comprise a primer film or barrier film, such as titanium, as is known in the art, located over and/or under the metal reflective layer.

The functional coating 46 can be deposited in any conventional manner, such as but not limited to magnetron sputter vapor deposition (MSVD), chemical vapor deposition (CVD), spray pyrolysis (i.e., pyrolytic deposition), atmospheric pressure CVD (APCVD), low-pressure CVD (LPCVD), plasma-enhanced CVD (PEVCD), plasma assisted CVD (PACVD), thermal or electron-beam evaporation, cathodic arc deposition, plasma spray deposition, and wet chemical deposition (e.g., sol-gel, mirror silvering etc.). When the functional coating is applied on the PH coating side of the substrate, it is preferred to apply the functional coating in the tin bath before the PH coating. When the functional coating is on the opposite side 60 from the PH coating, the functional coating can be applied after the tin bath in the float process as discussed above, e.g., on the tin side of the substrate 22 by CVD or MSVD.

While in the above discussion the PH coating was applied over the air side of the substrate and the functional coating was applied over the tin side of the substrate, it is to be understood that the functional coating could be applied over the air side of the substrate e.g., the float glass ribbon in the tin bath, and the PH coating subsequently applied over the tin side of the substrate by any desired method, such as those described above.

Advantages of the present invention over the sol-gel method of forming self-cleaning coatings include an ability to form a thin, dense, PH film on a substrate as opposed to the generally thicker, porous self-cleaning coatings obtained with the sol-gel coating method. Because the PH coatings of the present invention are thin, e.g., less than or equal to 500 Å, preferably less than or equal to 300 Å, they are aesthetically acceptable for use as a transparent coating on glass substrates. Still another advantage is that the method of providing a PH coating according to the present invention avoids the need to reheat the substrate after application of the coating or coating precursor as is required with the presently available sol-gel method. Not only does this render the present method less costly and more efficient e.g. but not limited to less equipment costs, less energy costs, less production time but also, the opportunity for sodium ion migration and in turn sodium ion poisoning of the PH coating of the present invention is significantly reduced. Further still, the method of the present invention is easily adapted to the formation of PASC coatings on continuous moving substrates, such as a glass float ribbon, where as the presently available sol-gel methods are not so easily adaptable.

The following example of the present invention is presented for illustration and the invention is not limited thereto.

EXAMPLE

A 48" (122 cm) wide PH coating of titanium dioxide having a thickness of 232 Å (determined by ellipsometry and transmittance data) was deposited by a conventional CVD process over a 152" (386 cm) float glass ribbon (3.3 mm thick clear glass) moving at a speed of 484 inches per minute (1,229 cm/min) in a conventional tin bath. The coating was formed from a precursor material of 0.07 mole percent of titanium tetraisopropoxide in a nitrogen containing carrier gas and was applied at a glass ribbon temperature of 1220° F. (659° C.). The coated ribbon was then annealed, i.e., cooled at a controlled rate, and cut into sample coupons of 3" (7.5 cm) by 6" (15 cm). The crystal structure of the deposited coating was determined to be anatase by x-ray diffraction. The coating had a photocatalytic activity of $1.8 \times 10^{-3}$ $cm^{-1}$ $min^{-1}$ as determined by the conventional stearic acid test and chromaticity coordinates (Illuminant C, 2° observer) of: reflectance ($R_1$) Y=19.43, x=0.2741, y=0.2774 and transmittance Y=78.50, x=0.3187, y=0.3279.

To measure the photoactive hydrophilicity of the coated article, sample coupons were ultrasonically cleaned for 20 minutes at 145° F. with a dilute (pH 2.9) aqueous cleaning solution of DART 210 cleaner commercially available from Madison Chemical Inc., of Madison, Ind. The sample coupons were then rinsed with room temperature deionized water, followed by a second ultrasonic cleaning in deionized water for 10 minutes at 155° F. The coupons were again rinsed with room temperature deionized water and blown dry with compressed nitrogen. The coupons were exposed to UV radiation from a UVA 340 bulb at 24 W/m$^2$ and the contact angle of a water droplet measured with time. Water droplet contact angles were measured on a Rame-Hart Tele-goniometer, Model 102-00-115 with the sample in a horizontal (non-inclined) position. For each sample measured, the water droplet contact angle dropped from about 21° to 47° to about 4° to 11° after about 30 mins of UVA-340 exposure, and to about 3° to 7° after about 60 mins exposure.

A Taber abrasion test was conducted on several sample coupons using a CS-10F wheel with a 1000 grams weight for 10 cycles and 25 cycles. Transmitted haze for each sample was determined to be 0.0 using a Pacific Scientific XL211 HazeGuard System. A Taber abrasion test was also conducted on five sample coupons in accordance with Test No. 18 of the ANSI Z 26.1-1983 (1000 cycles; 500 grams per wheel) procedure for abrasion resistance and gave an average increase in diffused light of 2.4%.

Sample coupons were subjected to several conventional testing procedures and the results are given in Table 1 below. The film degradation results are based on visual observation and reflected color measurements. The contact angle results were determined as described above.

TABLE 1

| Test | Description | Film Degradation | Contact Angle |
|---|---|---|---|
| Cleveland Condensation | 70 days; 100% RH; 60° C. (140° F.) | None | No change |
| Sulfuric Acid | 30 mins; 10 N sulfuric acid; 52° C. (125° F.) | None | No change |
| Citric Acid | 15 mins; 10% citric acid; 26° C. (79° F.) | None | No change |
| Ammonium Hydroxide | 1 min; 4% ammonium hydroxide, 23° C. (74° F.) | None | No change |
| Carbon-arc weather-o-meter | 1000 hrs; cycle 7 (102 min. light; 18 min. light; and water spray) | None | No change |
| Accelerated Weather Cycle Test | ASTM E-773 (5 weeks) | None | No change |

As shown in Table 1, the PH coating had no film degradation and maintained its photo-induced hydrophilicity after each of the tests.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

We claim:

1. An article, comprising:
   a transparent substrate having at least one surface; and
   a transparent, non-porous, photo-induced hydrophilic coating deposited over at least a portion of the at least one surface,
   wherein an outer surface of the photo-induced hydrophilic coating has a root mean square roughness of less than 2 nm,
   wherein the photo-induced hydrophilic coating is deposited by a process selected from chemical vapor deposition, magnetron sputtered vacuum deposition, and spray pyrolysis, wherein the photo-induced hydrophilic coating consists essentially of titanium dioxide and is an outermost coating exposed to the environment, and
   wherein the photo-induced hydrophilic coating has a thickness of less than or equal to 500 Å.

2. The article as claimed in claim 1, including at least one additional coating located between the non-porous, photo-induced hydrophilic coating and the substrate.

3. The article as claimed in claim 1, wherein a contact angle of a water droplet on the article is less than 5° after exposure of the coating to UVA340 radiation at 24 W/m$^2$ for 60 mins.

4. The article as claimed in claim 1, wherein the photo-induced hydrophilic coating has a thickness of less than or equal to 400 Å.

5. The article as claimed in claim 1, wherein the photo-induced hydrophilic coating has a thickness of less than or equal to 300 Å.

6. The article as claimed in claim 1, wherein the photo-induced hydrophilic coating has a thickness of less than or equal to 200 Å.

7. The article as claimed in claim 1, wherein the titanium dioxide is selected from the group consisting of anatase, rutile, brookite, amorphous, and mixtures or combinations thereof.

8. The article as claimed in claim 1, wherein the outer surface of the coating has a root mean square roughness in the range of 0.2 nm to 0.7 nm.

9. The article as claimed in claim 1, wherein the coating has a photocatalytic activity of less than or equal to $3 \times 10^{-3}$ cm$^{-1}$ min$^{-1}$.

10. The article as claimed in claim 2, wherein the additional coating is a functional coating selected from the group consisting of a sodium ion diffusion barrier, a solar control coating, and an antireflective coating.

11. The article as claimed in claim 1, wherein the article is selected from the group consisting of a monolithic or laminated window unit, an insulating glass unit, and an automotive transparency.

12. The article as claimed in claim 1, wherein titanium dioxide coating has a thickness in the range of 200 Å to 300 Å, a root mean square roughness of less than or equal to 1 nm, and a photocatalytic activity of less than or equal to $3 \times 10^{-3}$ cm$^{-1}$ min$^{-1}$.

13. The article as claimed in claim 1, wherein the substrate includes a first surface and a second surface, with the photo-induced hydrophilic coating deposited over at least a portion of the first surface and with a functional coating deposited over at least a portion of the second surface.

14. An article, comprising:
   a glass substrate having at least one surface;
   a non-porous, photo-induced hydrophilic coating consisting essentially of titanium dioxide and is an outermost coating exposed to the environment; and
   at least one additional coating located between the photo-induced hydrophilic coating and the substrate, wherein an outer surface of the photo-induced hydrophilic coating has a root mean square roughness of less than 2 nm, wherein the photo-induced hydrophilic coating is deposited by a process selected from chemical vapor deposition, magnetron sputtered vacuum deposition, and spray pyrolysis, wherein the photo-induced hydrophilic coating has a thickness of less than or equal to 500 Å, and wherein the photo-induced hydrophilic coating has a photocatalytic activity of less than or equal to $3\times10^{-3}$ cm$^{-1}$ min$^{-1}$.

* * * * *